us011205734B2

(12) United States Patent
France et al.

(10) Patent No.: US 11,205,734 B2
(45) Date of Patent: Dec. 21, 2021

(54) MULTIJUNCTION SOLAR CELLS WITH GRADED BUFFER BRAGG REFLECTORS

(71) Applicants: Alliance for Sustainable Energy, LLC, Golden, CO (US); California Institute of Technology, Pasedena, CA (US)

(72) Inventors: Ryan Matthew France, Golden, CO (US); John Franz Geisz, Wheat Ridge, CO (US); Pilar Espinet-Gonzalez, Pasadena, CA (US)

(73) Assignees: Alliance for Sustainable Energy, LLC, Golden, CO (US); California Institute of Technology, Pasedena, CA (US)

(*) Notice: Subject to any disclaimer, the term of this patent is extended or adjusted under 35 U.S.C. 154(b) by 0 days.

(21) Appl. No.: 16/283,375

(22) Filed: Feb. 22, 2019

(65) Prior Publication Data

US 2019/0259897 A1      Aug. 22, 2019

Related U.S. Application Data

(60) Provisional application No. 62/634,025, filed on Feb. 22, 2018, provisional application No. 62/714,225, filed on Aug. 3, 2018.

(51) Int. Cl.
*H01L 31/0687*      (2012.01)
*H01L 31/0304*      (2006.01)
*H01L 31/054*       (2014.01)

(52) U.S. Cl.
CPC .. *H01L 31/06875* (2013.01); *H01L 31/03046* (2013.01); *H01L 31/0547* (2014.12)

(58) Field of Classification Search
CPC .......... H01L 31/0687; H01L 31/06875; H01L 31/0725; H01L 31/076; H01L 31/078; H01S 5/183–187; Y02E 10/50–56
See application file for complete search history.

(56) References Cited

U.S. PATENT DOCUMENTS

| 9,257,586 B2 | 2/2016 | Meusel et al. |
| 2003/0146442 A1* | 8/2003 | Dawson .................. H01L 33/08 257/79 |
| 2010/0147366 A1 | 6/2010 | Stan et al. |

(Continued)

FOREIGN PATENT DOCUMENTS

| CN | 105097977 A | * | 11/2015 |
| CN | 205016542 U | * | 2/2016 |

OTHER PUBLICATIONS

CN-105097977-B Machine Translation.*

(Continued)

*Primary Examiner* — William E McClain
(74) *Attorney, Agent, or Firm* — Sam J. Barkley

(57) ABSTRACT

Distributed Bragg reflectors are incorporated into the compositionally graded buffers of metamorphic solar cells, adding functionality to the buffer without adding cost. The reflection aids in collection in subcells that are optically thin due to low diffusion length, high bulk recombination, radiation hardness, partially-absorbing quantum structures, or simply for cost savings. Performance enhancements are demonstrated in GaAs subcells with QWs, which is beneficial when GaAs is not the ideal bandgap.

14 Claims, 7 Drawing Sheets

(56) References Cited

U.S. PATENT DOCUMENTS

| | | | |
|---|---|---|---|
| 2015/0139261 A1* | 5/2015 | Matsuo | H01L 33/04 372/50.11 |
| 2015/0179857 A1* | 6/2015 | Lin | H01L 31/0687 136/255 |
| 2015/0357501 A1* | 12/2015 | Derkacs | H01L 31/03046 136/255 |

OTHER PUBLICATIONS

CN-205016542-U Machine Translation.*

Bett, et al. "III-V compounds for solar cell applications." Applied Physics A 69.2 (1999): 119-129.*

Bushnell, D.B. et al., "Short-circuit current enhancement in Bragg stack multi-quantum-well solar cells for multi-function space cell applications," Solar Energy Materials & Solar Cells, vol. 75, 2003, pp. 299-305.

Emelyanov, V.M. et al., "Multijunction GaInP/GaInAs/Ge Solar Cells with Bragg Reflectors," Semiconductors, 2010, vol. 44, No. 12, pp. 1600-1605.

France, R. et al., "Reduction of crosshatch roughness and threading dislocation density in metamorphic GaInP buffers and GaInAs solar cells," Journal of Applied Physics, vol. 111, 2012, pp. 103528-1 through 103528-7.

France, R. et al., "Pushing Inverted Metamorphic Multijunction Solar Cells Toward Higher Efficiency at Realistic Operating Conditions," IEEE Journal of Photovoltaics, vol. 3, No. 2, Apr. 2013, pp. 893-898.

France, R. et al., "Quadruple-Junction Inverted Metamorphic Concentrator Devices," IEEE Journal of Photovoltaics, vol. 5, No. 1, Jan. 2015, pp. 432-437.

France, R. et al., "Design Flexibility of Ultrahigh Efficiency Four-Junction Inverted Metamorphic Solar Cells," IEEE Journal of Photovoltaics, vol. 6, No. 2, Mar. 2016, pp. 578-583.

France, R. et al., "Metamorphic epitaxy for multijunction solar cells," Materials Research Society, MRS Bulletin, Mar. 2016, vol. 41, pp. 202-209.

Garcia, I. et al., "Thin, high quality GaInP commpositionally graded buffer layers grown at high growth rates for metamomrphic III-V solar cell applications," Journal of Crystal Growth, vol. 393, 2014, pp. 64-69.

Geisz, J.F. et al., "High-efficiency GaInP/GaAs/InGaAs triple-junction solar cells grown inverted with a metamorphic bottom junction," Applied Physics Letters, vol. 91, 2007, pp. 023502-1 through 023502-3.

Geisz, J.F. et al., "40.8% efficient inverted triple-junction solar cell with two independently metamorphic junctions," Applied Physics Letters, vol. 93, 2008, pp. 123505-1 through 123505-3.

Geisz, J. et al., "Generalized Optoelectronic Model of Series-Connected Multijunction Solar Cells," IEEE Journal of Photovoltaics, vol. 5, No. 6, Nov. 2015, pp. 1827-1839.

Giles, C.R., "Lightwave Applications of Fiber Bragg Gratings," Journal of Lightwave Technology, vol. 15, No. 8, Aug. 1997, pp. 1391-1404.

King, R.R. et al., "Band gap-voltage offset and energy production in next-generation multijunction solar cells," Progress in Photovoltaics: Research and Applications, vol. 19, 2011, pp. 797-812.

Mcmahon, W.E. et al., "Effect of Atmospheric Absorption Bands on the Optimal Design of Multijunction Solar Cells," 44th IEEE PVSC Conference, Washington D.C., 2017, pp. 0268-0274.

Schulte, K. et al., "Highly Transparent Compositionally Graded Buffers for New Metamorphic Multijunction Solar Cell Designs," IEEE Journal of Photovoltaics, vol. 7, No. 1, Jan. 2017, pp. 347-353.

Schulte, K. et al., "Strategies for Thinning Graded Buffer Regions in Metamorphic Solar Cells and Performance Tradeoffs," IEEE Journal of Photovoltaics, vol. 8, No. 5, Sep. 2018, pp. 1349-1353.

Sheppard, C.J.R., "Approximate calculation of the reflection coefficient from a stratified medium," Pure and Applied Optics: Journal of the European Optical Society, Part A, 1995, vol. 4, pp. 665-669.

* cited by examiner

MULTIJUNCTION SOLAR CELLS WITH GRADED BUFFER BRAGG REFLECTORS

CROSS-REFERENCE TO RELATED APPLICATIONS

This application claims priority under 35 U.S.C. § 119 to U.S. Provisional Patent Application Nos. 62/634,025 and 62/714,225 filed on 22 Feb. 2018 and 3 Aug. 2018, respectively. The contents of which are both hereby incorporated by reference in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Metamorphic multijunction solar cells have achieved extremely high efficiencies using lattice-mismatched subcells with optimal bandgaps that are accessed through the use of compositionally graded buffers (CGBs), where the lattice constant of the epitaxial material is slowly varied over several microns of growth while maintaining a low dislocation density suitable for solar cells.

SUMMARY

Exemplary embodiments of the invention provide a distributed Bragg reflector (DBR) within a metamorphic layer. The combination of a DBR within a metamorphic layer, referred to herein as a graded buffer Bragg reflector or a metamorphic DBR, provides the functionality of both components with the epitaxial thickness and cost of only one. DBRs consist of alternating $\lambda/4n$ layers ($\lambda$ is the target wavelength and n is the refractive index) of contrasting refractive index, and commonly consist of AlGaAs and GaAs for GaAs-based lasers. Graded buffer Bragg reflectors can be made using combinations of GaInP, AlGaInP, GaAsSb, AlGaASb, GaInAs, or AlGaInAs, but for ease, AlGaInAs is a natural choice for a graded buffer Bragg reflector in an inverted metamorphic multijunction (IMM) device, which uses a GaAs substrate. Indium provides most of the lattice constant change throughout the buffer because AlAs has roughly the same lattice constant as GaAs. Meanwhile, indium does not drastically change the refractive index of $Ga_xIn_{1-x}As$, and so the Al fraction largely determines the refractive index of AlGaInAs. AlAs and GaAs have the most index contrast but can't be used throughout the buffer, because indium is added to the group-III site which limits the fraction of group-III sites available for Al. In addition, the IMM requires transparency of the buffer to the filtered light it receives, leading to an increasing minimum Al-fraction as the In-fraction increases. FIG. 1 depicts the expected reflectance at 800 nm from an $Al_xGa_{1-x}As/Al_{1-x}Ga_xAs$ DBR as a function of the number of pairs (and thus buffer thickness), using a simple model to highlight design considerations.

Both 3- and 4-junction IMM structures contain 1.0-eV $Ga_{0.7}In_{0.3}As$ subcells, making the subcell a relevant target for metamorphic DBR applications. The final layers of the graded buffer, nearing 30% In-fraction, should contain about 30% Al-fraction in order to maintain transparency. In an embodiment, the DBR is created by consistently altering Al-fraction between 30% and 70% throughout the buffer due to the transparency and composition constraints, even though this method is not optimal for achieving the greatest possible reflection. Each $Al_{0.3}Ga_{1-x}In_xAs/Al_{0.7}Ga_{1-x}In_xAs$ pair has a constant In-fraction, with the In-fraction increased every pair. In an embodiment, the $Ga_{0.7}In_{0.3}As$ subcell is 2% mismatched to the GaAs substrate, resulting in a 2-μm-thick buffer when using a standard strain-grading rate (percent misfit per micron of growth) of 1%/μm, and allows $Al_{0.3}Ga_{1-x}In_xAs/Al_{0.7}Ga_{1-x}In_xAs$ pairs, as shown in an embodiment in FIG. 1. FIG. 2 depicts the relevant parameters of the buffer, including the composition, nominal bandgap (which alternates between direct and indirect), lattice constant, and refractive index of each layer.

In an embodiment, one graded buffer Bragg reflector is implemented into an inverted metamorphic GaAs/$Ga_{0.7}In_{0.3}As$ 2-junction device and compared with the same structure where the graded buffer and Bragg reflector are grown independently, where the separate DBR consists of alternating layers of $Al_{0.3}Ga_{0.7}As/Al_{0.7}Ga_{0.3}As$ and the buffer has an identical indium content, but the Al-fraction is fixed at 30%. The GaAs subcell is intentionally thinned 800 nm in these 2 J devices in order to monitor the added absorption from the DBR's reflection. The peak reflectance wavelength for these DBRs is 800 nm, making the low and high Al-fraction layers 59 nm and 64 nm, respectively. A second graded buffer Bragg reflector is implemented into an inverted metamorphic triple junction GaInP/GaAs/$Ga_{0.7}In_{0.3}As$ device.

The GaAs subcell in the 3 J contains 80 strain-balanced $GaAs_{0.9}P_{0.1}/Ga_{0.9}In_{0.1}As$ quantum wells (QWs), which partially absorb below the GaAs bandedge. The target peak wavelength is 910 nm, making the low and high Al-layer thicknesses 67 nm and 72 nm, respectively. In an embodiment, FIG. 3 depicts the general device structures.

In an embodiment, devices are grown by MOVPE using standard precursors, inverted onto Si handles, and processed with standard photolithography and electrochemistry techniques. The reflectance of the DBRs is then tested on a cleaved portion of the sample with the GaAs subcell removed via etching. A $MgF_2$/ZnS antireflection coating is thermally deposited on all samples, including the samples for reflectance testing. EQE and light-IV are tested on custom built simulators for multijunction cells, including LEDs for light biasing and spectral adjustment.

In an embodiment, metamorphic solar cells disclosed herein have optimal bandgap combinations through the use of compositionally graded buffers, where the lattice constant is slowly varied over several microns of growth. Bragg reflectors consist of several microns of alternating layers with refractive index contrast, and provide a useful internal reflection to multijunction solar cells with optically thin subcells. In an embodiment, distributed Bragg reflectors within the compositionally graded buffers of inverted metamorphic solar cells are implemented to add functionality to the buffer. The reflectance of this AlGaInAs "graded buffer Bragg reflector" is very similar to the reflectance of a similar AlGaAs Bragg reflector external to a buffer as well as the reflectance predicted by the transfer matrix model, indicating that the roughness of the buffer does not drastically reduce the reflection. 72%, 91%, and 98% reflectance are achieved in 2 μm, 4 μm, and 8 μm buffers using AlGaInAs layers that alternate between 30% and 70% Aluminum content. Using a 2 μm graded buffer Bragg reflector, the 1.0-eV mismatched subcell of a GaAs/GaInAs tandem has a minor increase in threading dislocation density compared to a standard graded buffer and a small, 20 mV, loss in voltage. As the buffer is thickened, the voltage loss is recuperated and excellent subcell voltages are achieved, indicating that the Bragg reflector is not severely hindering dislocation glide. In an embodiment, the benefits of the graded buffer Bragg reflector for optically thin subcells and subcells containing quantum wells are demonstrated and show that Bragg reflectors are effectively implemented within graded buffers, adding functionality without adding cost.

In an aspect disclosed herein is a multijunction solar cell comprising at least one graded buffer Bragg reflector. In an embodiment, the solar cell has an efficiency of at least 36.5 percent when taken under a one-sun illuminated global spectrum at 1000 W/m2 at 25° C. In an embodiment, the solar cell an efficiency of at least 36.6 percent when taken under a one-sun illuminated direct spectrum at 1000 W/m2 at 25° C. In an embodiment, the solar cell has an efficiency of at least 32 percent when taken under a one-sun illuminated AM0 spectrum at 1000 W/m2 at 25° C. In another embodiment, the solar cell has a graded buffer Bragg reflector having at least 72% internal reflectance. In an embodiment, the solar cell has a graded buffer Bragg reflector is at least 2 μm thick. In another embodiment, the solar cell has a relative voltage (Woc) of at least a subcell of the multijunction solar cell is lower than about 0.42 V wherein the subcell is about 1.0 eV. In an embodiment, the solar cell has a graded buffer Bragg reflector having at least 91% internal reflectance. In an embodiment, the solar cell has a graded buffer Bragg reflector is at least 4 μm thick. In another embodiment, the solar cell has a relative voltage (Woc) of at least a subcell of the multijunction solar cell is lower than about 0.39 V wherein the subcell is about 1.0 eV. In yet another embodiment, the solar cell has a graded buffer Bragg reflector having at least 98% internal reflectance. In an embodiment, the solar cell has a graded buffer Bragg reflector is at least 6 μm thick. In an embodiment, the solar cell has a relative voltage (Woc) of at least a subcell of the multijunction solar cell is lower than about 0.38 V wherein the subcell is about 1.0 eV. In another embodiment, the solar cell has at least one graded buffer Bragg reflector that is comprised of layers of an alloy having an Aluminum content of between 30 mole percent and 70 mole percent. In an embodiment, the solar cell has at least one graded buffer Bragg reflector that is comprised of layers of an alloy having an Aluminum content of between 10 mole percent and 90 mole percent. In another embodiment, the solar cell has at least one graded buffer Bragg reflector that has AlGaInAs In another embodiment, the solar cell contains at least one graded buffer Bragg reflector that has pairs of alternating layers of $Al_{0.3}Ga_{0.7-x}In_xAs$ and $Al_{0.7}Ga_{0.3-x}In_xAs$. In an embodiment, the solar cell contains alternating layers of $Al_{0.3}Ga_{0.7-x}In_xAs$ and $Al_{0.7}Ga_{0.3-x}In_xAs$ and each of the pairs of alternating layers of $Al_{0.3}Ga_{0.7-x}In_xAs$ and $Al_{0.7}Ga_{0.3-x}In_xAs$ increases in In mole percent over the previous layer. In yet another embodiment, the solar cell has at least one band gap between 0.9 and 1.1 eV.

In an aspect, disclosed is an inverted metamorphic multijunction solar cell comprising at least one compositionally graded buffer comprising at least one distributed Bragg reflector.

Other objects, advantages, and novel features of the present invention will become apparent from the following detailed description of the invention when considered in conjunction with the accompanying drawings.

DETAILED DESCRIPTION

Figure 1:
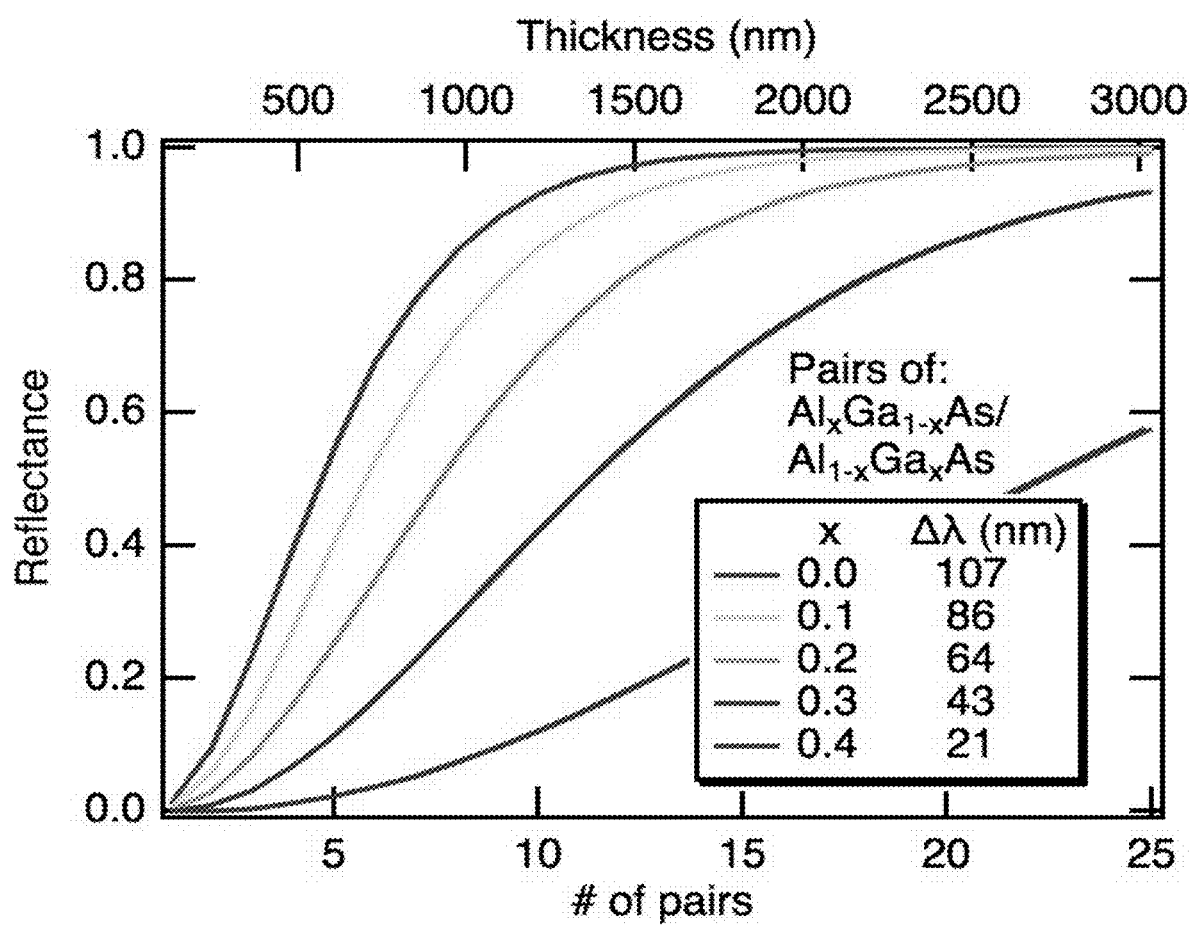
FIG. 1. depicts 800 nm reflectance of $Al_xGa_{1-x}As/Al_{1-x}Ga_xAs$ pairs for various values of x. The total thickness of the DBR is included on the top axis to compare with the thickness of standard graded buffers, and the bandwidth, Δλ, is included in the legend.

Metamorphic multijunction solar cells have achieved extremely high efficiencies and are now commercially available. Lattice-mismatched subcells with low threading dislocation density enable high efficiencies by allowing an optimal multijunction bandgap combination with minimal performance loss from the lattice-mismatch. These mismatched subcells are accessed through the use of compositionally graded buffers (CGBs), where the lattice constant of the epitaxial material slowly varies over several microns of growth in order to maintain a suitably low dislocation density for solar cells.

Dislocations nucleate and glide to relieve strain in the buffer, and the achievable dislocation density depends on the buffer structure and growth conditions. The thickness of the compositionally graded buffer is a critical parameter and is inversely related to the final threading dislocation density. Dislocations introduce nonradiative recombination centers into the device, so limiting the number of required dislocations by using thick buffers benefits device performance. However, additional epitaxy is expensive, and so performance-cost tradeoffs exist in the design of metamorphic multijunction devices. It has been shown that compositionally graded buffers can be used optically as well as structurally by implementing the buffer within the optical cavity of a laser. Adding functionality to the buffer adds value without necessarily increasing cost, which alters device cost structure and performance tradeoffs.

In an embodiment disclosed herein are methods and devices for the implementation of distributed Bragg reflectors (DBRs) within graded buffers, which can take advantage of the thickness of the buffer to add functionality. The reflection from this "graded buffer Bragg reflector" can aid incomplete absorption in the above junction, which is helpful for subcells that are optically thin due to low diffusion length, high bulk recombination, radiation hardness demands, partially-absorbing quantum structures, or simply require cost savings. However, some concerns arise: the buffer naturally has crosshatch roughness due to strain fields from the underlying dislocations, which could lead to low reflectance from a DBR. The DBR introduces many interfaces into the buffer that might add to device series resistance or introduce unintended parasitic absorption. In addition, the residual threading dislocation density of the buffer is very sensitive to the structure, growth conditions, and material quality of the buffer. The Bragg reflector must not reduce dislocation glide in the buffer, or the performance of the mismatched subcell will suffer. Disclosed herein is the use of graded buffer Bragg reflectors (GBBR) in inverted metamorphic multijunction (IMM) solar cell devices through analyzing the reflectance of the buffer as well as the device performance.

I. Graded Buffer Bragg Reflector Design

A distributed Bragg reflector consists of alternating $\lambda/4n$ layers ($\lambda$, is the target wavelength and n is the refractive index) of contrasting refractive index, and commonly consists of AlGaAs and GaAs for GaAs-based lasers. AlGaInAs has already been used for graded buffers in IMMs, and so is a natural choice to study graded buffer Bragg reflectors. For the buffer design, AlGaInAs lattice constants and optical constants are needed to determine reflection, transparency, and compositional grading. Disclosed herein are methods to calculate the lattice constants of AlGaInAs using standard published binary lattice constants and Vegard's law. Most of the lattice constant change throughout the buffer is provided by step-grading the indium fraction of the alloy. Large changes in aluminum content only result in small changes to the lattice constant since even the binaries AlAs and GaAs have less than 0.2% lattice mismatch.

AlGaInAs optical constants over the wide range of potential alloys have not all been experimentally measured, but data exist for various compounds lattice-matched to GaAs and InP, as well as data for GaInAs throughout the ternary range. Bandgap energies have also been determined and are used to qualitatively determine transmission limits. Although the alloy indium content alters the absorption edge, the refractive index for transparent wavelengths (below bandgap energies) is not a strong function of the indium content. On the other hand, the aluminum content has a large impact on the refractive index. Thus, there is a convenient separation between the functions of the indium content and the aluminum content in the AlGaInAs alloy that eases GBBR design: the indium is largely responsible for strain grading and the aluminum content is largely responsible for refractive index changes.

The refractive index contrast between the layers of the DBR determine the peak reflectance and bandwidth of the reflection. AlAs and GaAs have the most index contrast but cannot be used throughout an AlGaInAs graded buffer because the increasing indium content in the buffer limits the fraction of group-III sites available for aluminum. In addition, the CGB in a multijunction device needs to be transparent to the filtered light it receives.

One final design consideration of the graded buffer Bragg reflector is the thickness. In a periodic DBR, the number of index-contrasting pairs increases with the thickness and leads to increased reflectance. In a CGB, increasing the thickness typically reduces the threading dislocation density and thus improves performance of a metamorphic subcell. However, performance gains with thickness are diminishing for both a CGB and a DBR and balanced by the extra cost associated with additional epitaxy.

FIG. 1 depicts the major design considerations for AlGaInAs graded buffer Bragg reflectors. The expected reflectance at 800 nm from an $Al_xGa_{1-x}As/A_{1-x}Ga_xAs$ DBR is calculated for various values of "x" as a function of the number of index-contrasting pairs, and thus buffer thickness, using a simple model. At 800 nm, the refractive index changes fairly linearly with aluminum content, so the total thickness of $Al_xGa_{1-x}As/A_{1-x}Ga_xAs$ pairs with different compositions is equivalent. The reflectance increases with thickness and aluminum content contrast, and the bandwidth of the stopband increases with aluminum contrast.

In an embodiment, the AlGaInAs graded buffers demonstrated herein access 1.0 eV Ga0.7In0.3As, which are used in both 3- and 4-junction IMM devices directly below a GaAs subcell. The final layers of an AlGaInAs graded buffer should have 30% In-content, which limits the maximum Al-content in these layers to about 70% due to composition restraints and the minimum Al-content to 30% in order to maintain transparency to light transmitted by the above GaAs subcell. To ease modeling and understanding, the GBBR design consistently alters Al-fraction between 30% and 70% throughout the entire buffer due to these transparency and composition constraints, even though alternate designs may lead to greater reflection or bandwidth.

Figure 2:
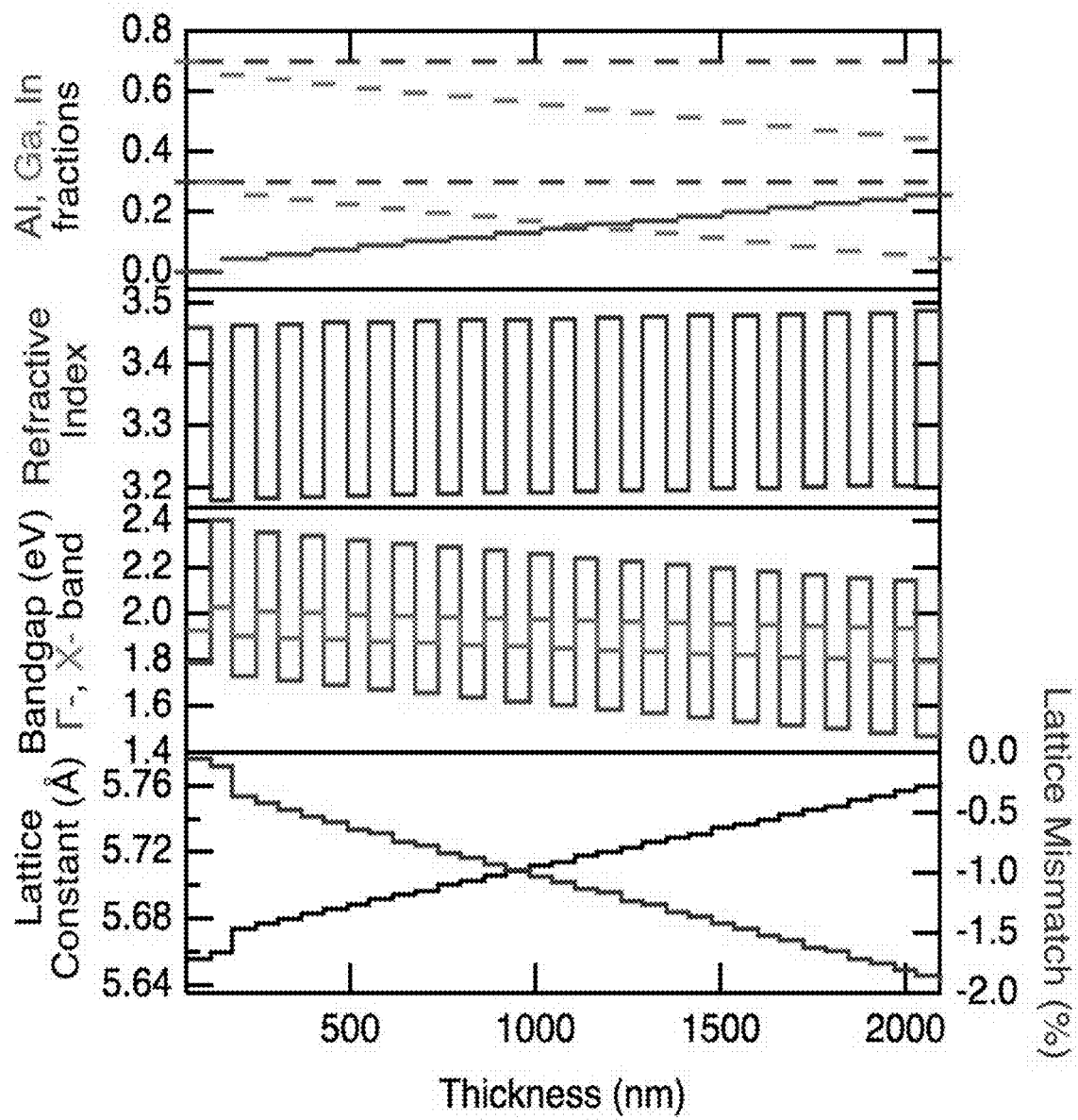
FIG. 2 depicts parameters of the graded buffer Bragg reflector, including composition, refractive index, bandgap, and lattice constant. The buffer increases in In-fraction while alternating layers of $Al_{0.3}Ga_{0.7-x}In_xAs/Al_{0.7}Ga_{0.3-x}In_xAs$ provide the refractive index contrast.

The $Ga_{0.7}In_{0.3}As$ subcell is 2% mismatched to the GaAs substrate, resulting in a 2-μm-thick buffer when using a strain grading rate (percent misfit per micron of growth) of 1%/μm. A GBBR that utilizes a standard buffer thickness, 2 μm, was made which results in 17 index-contrasting pairs (FIG. 1), and the GBBR performance with control samples were compared. Each $Al_{0.3}Ga_{0.7-x}In_xAs/Al_{0.7}Ga_{0.3-x}In_xAs$ pair has a constant In-fraction, with the In-fraction increased every pair. FIG. 2 depicts the relevant parameters of the buffer, including the composition, nominal bandgap (which alternates between direct and indirect), lattice constant, and refractive index of each layer. In addition to control comparisons, the thickness of the buffer and thus number of alternating pairs are varied in order to investigate threading dislocation density and reflectance tradeoffs with thickness.

II. Experimental Methods

Figure 3:
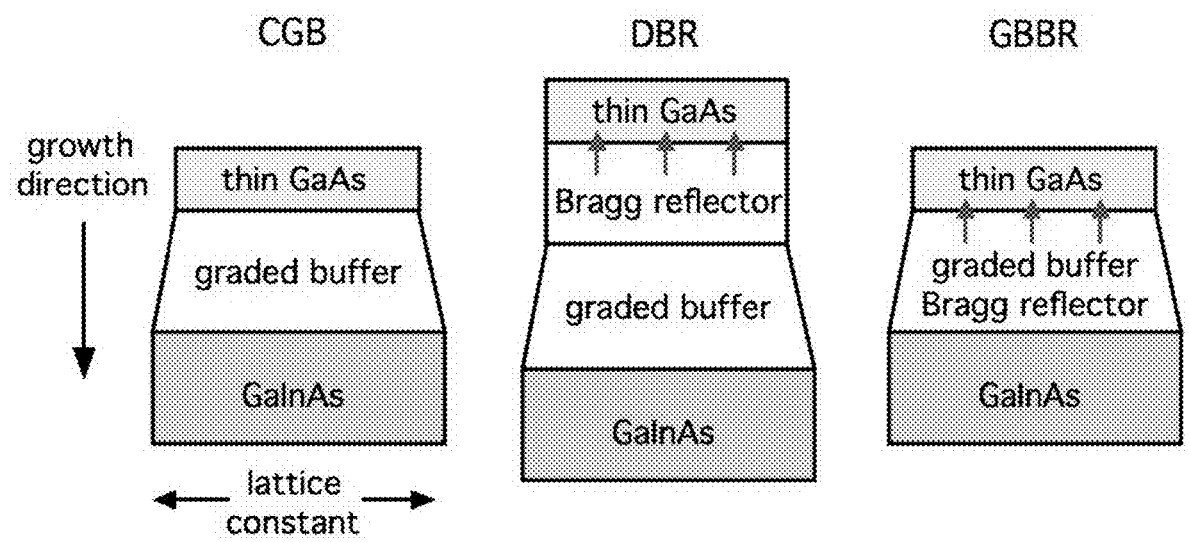
FIG. 3. depicts an illustration of an embodiment of a 2-junction inverted metamorphic GaAs/$Ga_{0.7}In_{0.3}As$ device. A device with a standard $Al_{0.3}Ga_{0.7-x}In_xAs$ compositionally graded buffer (CGB) is compared with a device with a DBR and $Al_{0.3}Ga_{0.7-x}In_xAs$ buffer grown independently (DBR), and then with a device with a AlGaInAs graded buffer Bragg reflector (GBBR), where the graded buffer and Bragg reflector are grown together. The green arrows indicate light reflected back from DBR and GBBR.

Two junction (2 J) and three junction (3 J) inverted metamorphic (IMM) solar cell devices were grown by atmospheric pressure metalorganic vapor phase epitaxy (MOVPE) on (001) GaAs substrates miscut 6° toward (111)A. The AlGaInAs graded buffer Bragg reflector depicted in FIG. 2 is implemented into $GaAs/Ga_{0.7}In_{0.3}As$ 2 J IMM devices and compared with two control samples in order to test the performance of the buffer, as illustrated in FIG. 3. The GaAs subcell was optically thinned to 800 nm in the devices in order to monitor the added absorption from the reflectors, and used GaInP passivating layers. The 1.0-eV $Ga_{0.7}In_{0.3}As$ subcell was 2 µm thick, with GaInP passivating layers. The graded buffer began with the GBBR, but has final layers of $Al_{0.5}Ga_{0.5-x}In_xAs$ that used the same strain grading rate as the GBBR and a 0.5-µm thick overshoot layer to allow strain-free $Ga_{0.7}In_{0.3}As$ cell growth. The control samples had identical structures in the subcells, but different inactive material between the cells: one had a standard $Al_{0.3}Ga_{0.7-x}In_xAs$ graded buffer without a DBR, and one had an $Al_{0.3}Ga_{0.7-x}In_xAs$ graded buffer plus an $Al_xGa_{1-x}As$ DBR grown independently of the buffer, where the DBR used the same thicknesses and Al-content as the GBBR. In addition to control sample comparisons, the thickness of the GBBR were varied in order to test performance-thickness tradeoffs. The samples had GBBR thickness of 2 µm, 4 µm, and 8 µm, which have 17, 34, and 68 pairs, respectively. The number of Aluminum contrasting pairs per Indium step were 1, 2, and 4, respectively, and the total number of Indium steps was equivalent between the samples. The 3 J-IMM used a 2.2 µm GaInP top cell with AlInP window and AlGaInP back-surface field. The GaAs subcell contains 80 GaInAs/GaAsP MQWs in the i-region and an additional 2 µm of base. The GBBR was identical to FIG. 2 but targets 910 nm peak reflectance with slightly thicker layers. The GaInAs subcell was slightly lower bandgap, 0.93 eV, accessed with additional $Al_{0.5}Ga_{0.5-x}In_xAs$ buffer after the GBBR.

After growth, the samples were diced into three pieces. One portion of the sample was unprocessed, leaving the lattice mismatched $Ga_{0.7}In_{0.3}As$ subcell near the top surface, and used for cathodoluminescence characterization of the threading dislocation density. Two portions of the sample were electroplated with a gold back contact, inverted and bonded to Si handles using epoxy, and the substrate was removed via etching. Then, one of these inverted pieces was further etched down through the lattice-matched subcell, exposing the CGB, DBR, or GBBR, depending on the sample. A $MgF_2/ZnS/MgF_2/ZnS$ anti-reflection coating (ARC) was thermally deposited on this piece for testing the reflection from the CGB, DBR, or GBBR. The other inverted piece was processed with solar cell devices. Photolithography was used to define contact areas and Ni/Au contacts were electroplated on the Se-doped GaInNAs contact layer, which was subsequently etched away in unmetallized areas, exposing the window layer. The devices were fully isolated down to the back Au contact, and a $MgF_2/ZnS/MgF_2/ZnS$ ARC was thermally deposited.

Solar cell device testing consisted of illuminated I-V, dark I-V, quantum efficiency, reflection, and electroluminescence. Illuminated I-V of 2-junction cells was performed in a custom continuous 1-sun simulator with a combination of light from a Xe bulb and LEDs for spectral tuning, and the I-V of the 3-junction cells was taken in a one sun multi-source solar simulator (OSMSS). Dark I-V and electroluminescence were performed in a custom tool using a calibrated fiber optic and a spectroradiometer, using methods described previously to determine the subcell voltages. Specular reflectance and external quantum efficiency (EQE) of each junction were measured by scanning chopped monochromatic light over the entire wavelength range while light biasing individual junctions, and the effects of luminescent coupling were removed after measurement.

The cathodoluminescence measurements were performed on a JEOL JSM-7600F SEM equipped with parabolic mirror collection system and a liquid nitrogen cooled Ge detector. The accelerating voltage and beam current of the incident electrons were 15 kV and about 1 nA, respectively. Four randomly selected regions were tested on each sample, equal to a total area of about 0.02 $mm^2$. Dark spots were counted and averaged from these regions to determine the threading dislocation density (TDD).

III. Graded Buffer Bragg Reflector Performance

Reflectance of Bragg Reflectors

Figure 4:
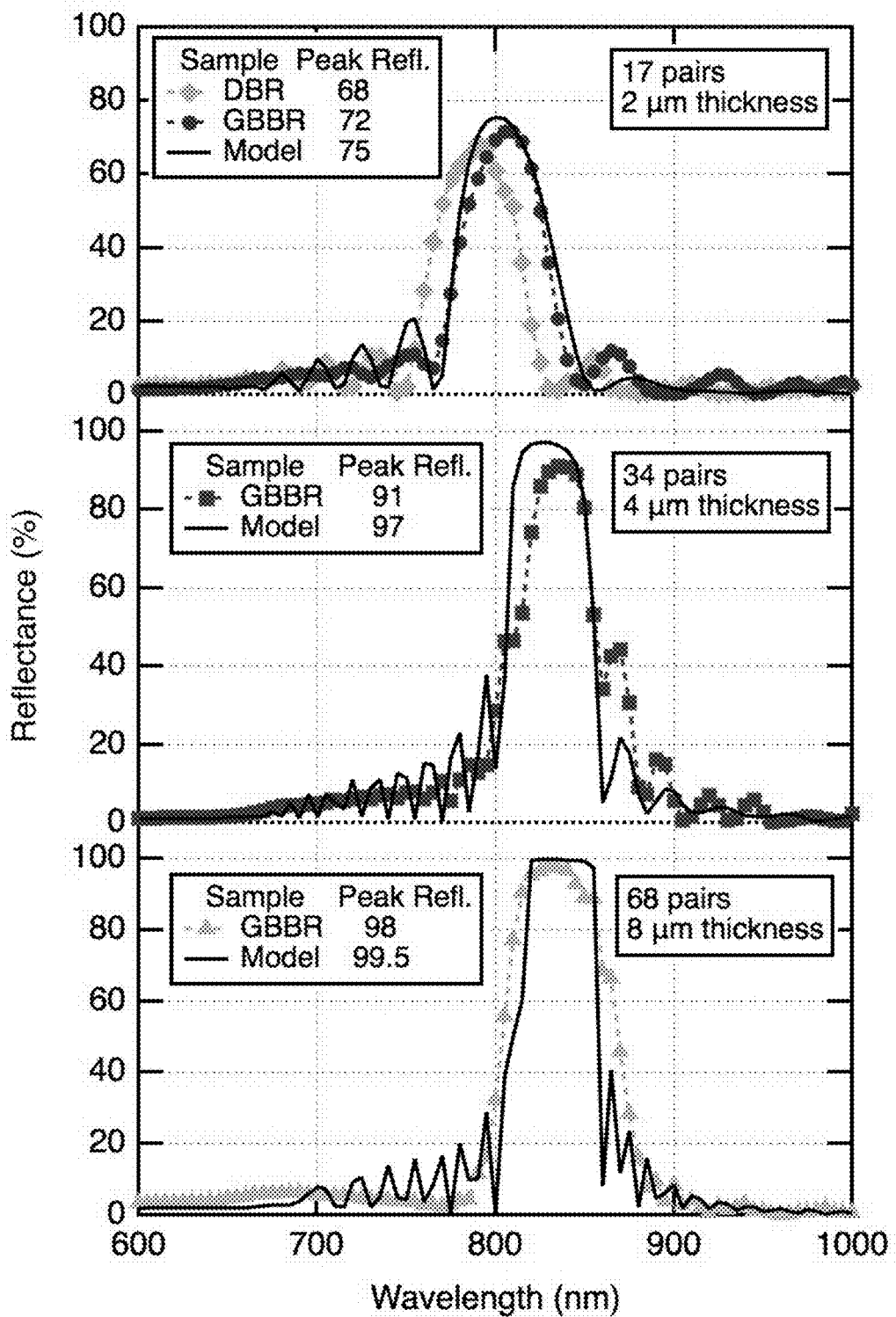
FIG. 4 depicts measured and modeled reflectance from various AlGaInAs Bragg reflectors. (top) 17 pairs of $Al_{0.3}Ga_{0.7}As/Al_{0.7}Ga_{0.3}As$ external to a graded buffer (DBR) and $Al_{0.3}Ga_{0.7-x}In_xAs/Al_{0.7}Ga_{0.3-x}In_xAs$ internal to a graded buffer (GBBR). (middle) 34 pairs of $Al_{0.3}Ga_{0.7-x}In_xAs/Al_{0.7}Ga_{0.3-x}In_xAs$ GBBR. (bottom) 68 pairs of $Al_{0.3}Ga_{0.7-x}In_xAs/Al_{0.7}Ga_{0.3-x}In_xAs$ GBBR. Each GBBR is compared with the transfer matrix model of the structure using $Al_{0.3}Ga_{0.7}As/Al_{0.7}Ga_{0.3}As$ alternating pairs.

The specular reflectance from the DBR or GBBRs in 2 J IMM devices was measured by removing the GaAs subcell and coating the DBR or GBBR with an ARC. The top graph in FIG. 4 compares the reflectance of the Bragg reflector internal to a graded buffer (GBBR) to the reflectance from the control sample with a similar Bragg reflector grown independently of the graded buffer (DBR), both structures using 17 alternating pairs. The reflectance of both samples is compared with the reflectance predicted by the transfer matrix model, using n and k data for AlGaAs compounds from the SOPRA database. The peak reflectance of the graded buffer Bragg reflector is 72% with a bandwidth of 55 nm. Good agreement between the measured and modeled reflectance is observed. The model predicts slightly higher reflectance, 75%, for this structure. However, the DBR external to the graded buffer yields lower reflection, 68%, indicating that some of the error between model and experiment in the GBBR is not related to the graded buffer. Thus, the imperfect interfaces and dislocations of the graded buffer do not significantly reduce the reflectance of the Bragg reflector, and still result in a useful reflectance for metamorphic optoelectronic devices.

The middle and bottom graphs of FIG. 4 show the specular reflectance of GBBRs with increasing thickness and an increasing number of index-contrasting pairs, which is expected to increase reflection. As the buffer thickness increases from 2 µm to 4 µm and 8 µm, the number of pairs increases from 17 to 34 and 68, respectively, and the measured reflection increases from 72% to 91% and 98%, respectively. The peak reflection appears to shift towards longer wavelengths for thicker buffers, but this is due to growth reactor calibration drift that was determined separately, and the modeled reflection has been adjusted for this change. Compared to the model, the measured strength of the side-lobes is reduced with additional buffer thickness, which indicates a slight incoherence in the DBR. The underlying reason for side-lobe reflection reduction is not known, but could be related to imperfect interfaces or layer thicknesses within the buffer related to crosshatch roughness. It could also be related to the change in Indium content throughout the buffer which overlays a small refractive index change on top of change due to the alternating aluminum, and an error when comparing to the simple $Al_{0.7}Ga_{0.3}As/Al_{0.3}Ga_{0.7}As$ model.

The modeled reflection is slightly higher than the measured reflection in each case. In part, a higher modeled reflectance is expected because the model is only using AlGaAs rather than AlGaInAs, but is likely also slightly influenced by the buffer as well as growth imperfections. However, the reflectance increases with GBBR thickness close to modeled predictions and very high 98% reflection is demonstrated in a thick GBBR despite the limited index-contrast due to the IMM application, crosshatch roughness and dislocations of the buffer.

Device Quantum Efficiency and Reflectance

Figure 5:
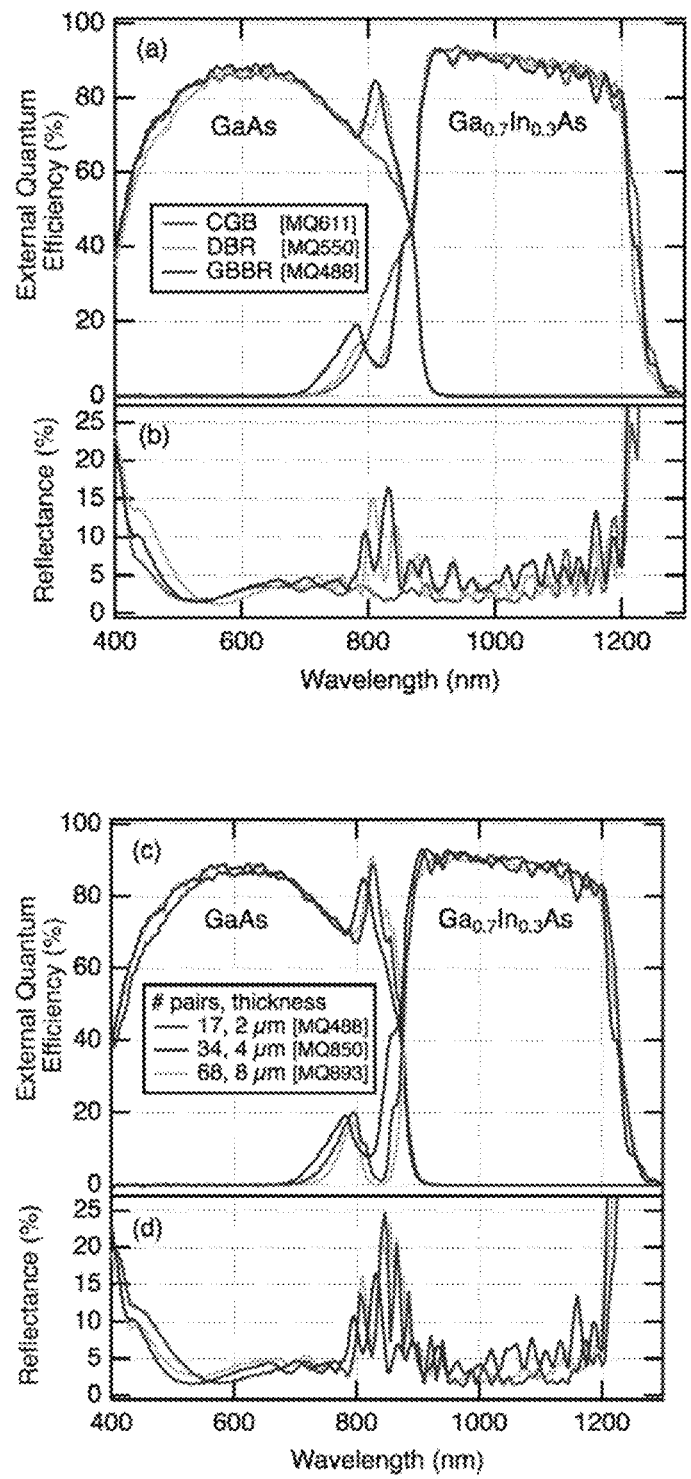
FIG. 5 depicts external quantum efficiency (EQE) and reflection of various inverted metamorphic 2-junction GaAs/$Ga_{0.7}In_{0.3}As$ solar cells. The EQE of both subcells is shown: the shorter wavelength response is from the GaAs subcell and the longer wavelength response is from the $Ga_{0.7}In_{0.3}As$ subcell. (a) EQE and (b) reflection from a device with a graded buffer Bragg reflector (GBBR) compared to a device with a standard graded buffer and no Bragg reflector (CGB), as well as a device with a standard graded buffer and an independently-grown Bragg reflector (DBR). (c) EQE and (d) reflection from 2-junction devices with varying GBBR thickness, 2 μm, 4 μm, and 8 μm.

The EQE of the bottom junction of the 2 J IMM devices gives a good measure of the transmittance through the graded buffers. FIGS. 5 (a) and (b) compare the EQE and reflectance, respectively, of the device with a 2-µm-thick GBBR to a device with a standard graded buffer (CGB) and a device with a standard graded buffer with a Bragg reflector grown independently (DBR). FIGS. 5 (*c*) and (*d*) compare the EQE and reflectance, respectively, of devices with varied GBBR thickness. A clear increase in the EQE of the GaAs subcell is observed at 800 nm in devices with Bragg reflectors. A corresponding decrease in the EQE of the $Ga_{0.7}In_{0.3}As$ subcell is also observed at 800 nm. The photocurrent of the GaAs subcell in the GBBR device in FIG. 5 (*a*) is 0.5 mA/cm² higher than the CGB device, as calculated from the integration of the EQE with the global spectrum between 750 and 950 nm. This gain demonstrates the utility of the GBBR for optically thin subcells. Increasing the GBBR thickness increases the EQE peak as expected, shown in FIG. 5 (*c*).

An increase in reflection loss around the DBR peak wavelength is observed due to light that fully passes through the GaAs subcell two times, which represents a design tradeoff. The DBR can reduce the transmission loss of an optically thin subcell, but not to zero: the second pass of light is absorbed with similar EQE as the first pass. Thus, the magnitude of photocurrent loss depends on the EQE and the spectral content. The reflection loss increases with GBBR thickness as the reflectance of the GBBR increases, as depicted in FIG. 5 (*d*).

Parasitic absorption from the graded buffer Bragg reflector is measured using the EQE and reflectance of the $Ga_{0.7}In_{0.3}As$ subcell in the longer wavelength range. The graded buffers were designed to be transparent to 880 nm. The transparency of the devices without GBBRs is reduced for 700-880 nm wavelengths because the independent CGB was only designed to be transparent to 880 nm, as is observed as a lower EQE in the $Ga_{0.7}In_{0.3}As$ subcells in FIG. 5(*a*). The final layers of the buffers without GBBR have a fixed 30% Al-fraction rather than layers alternating between 30%-70% Al-fraction, and so are more absorbing by design. Increased absorption between 700-880 nm is also observed in the GBBR devices with increasing thickness. The transparency requirement of the GBBRs depends on the application, and is an important consideration for optically thin subcells and particularly inverted devices.

The external quantum efficiency of the $Ga_{0.7}In_{0.3}As$ subcell in the 900-1200 nm range is nearly equivalent for all devices, meaning that there is no large unintended absorption in the GBBR. However, the EQE of the GBBR-device is slightly lower than the control samples in FIG. 5(*a*) due to a small increase in reflection, observed in FIG. 5(*b*). The subcell photocurrent predicted by integrating the EQE with the global spectrum between 900-1200 nm is 0.14 mA/cm² lower for the GBBR device than the CGB device: a small but measurable loss. As the GBBR thickness is increased, the reflection in the 900-1200 nm range decreases. The reflection loss of these devices is consistent with the reflection measured directly from the reflectors in FIG. 4, where the reflection of thicker GBBRs in the 900-1200 nm range is lower due to a reduction in sidelobe reflection.

Side-lobe reflection of DBR structures is a consideration for multijunction devices, where the reflective wavelength range needs to be carefully controlled. However, the thicker GBBRs disclosed herein naturally reduce this loss, resulting in an unexpected benefit. In thinner buffers, side-lobe loss can likely also be accomplished using index-contrast grading, or apodization. Increasing the index-contrast in the low-Indium content layers of the GBBR is possible by using greater aluminum contrast, such as $Al_{0.9}Ga_{0.9-x}In_xAs/Al_{0.1}Ga_{0.1-x}In_xAs$ pairs, without reducing the transparency of the buffer. In an embodiment, the aluminum contrast is maximized while maintaining transparency in each layer of the buffer, which should both reduce side-lobe reflection as well as increase peak reflectance.

Mismatched Subcell Voltage and Dislocation Density

Figure 6:
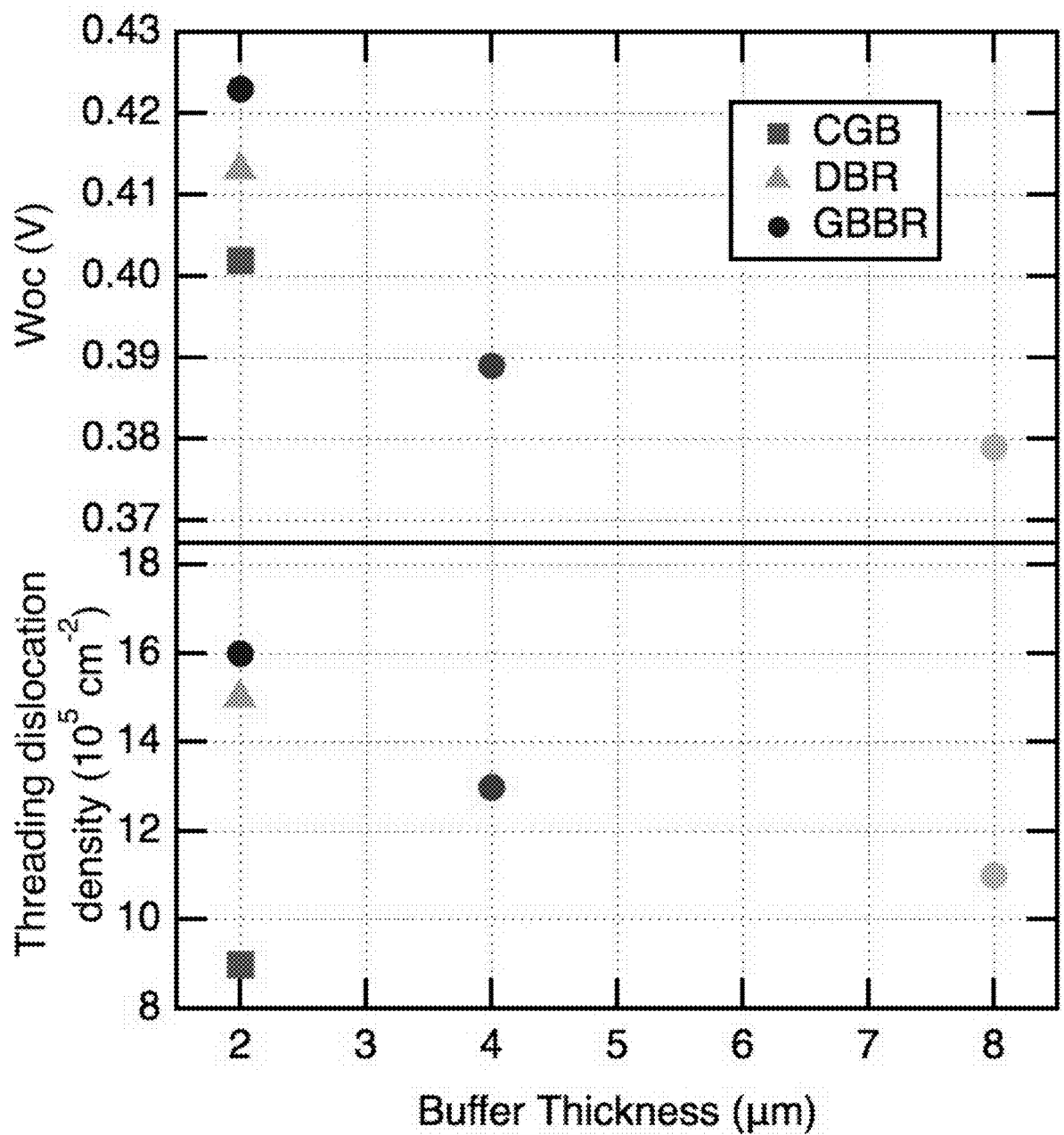
FIG. 6 depicts (top) $W_O$ and (bottom) threading dislocation density of the mismatched $Ga_{0.7}In_{0.3}As$ subcell of all 2-junction devices in this study. The coloring scheme matches FIGS. 4 and 5.

The increase in photocurrent due to reflection of the GBBR is clearly beneficial for multijunction devices. However, if the GBBR increases the threading dislocation density of the mismatched subcell, voltages losses will counteract the photocurrent gain, creating efficiency tradeoffs. The subcell voltage of the mismatched $Ga_{0.7}In_{0.3}As$ subcell is determined from electroluminescence at 15 mA/cm², and the threading dislocation density is measured using cathodoluminescence, both shown in FIG. 6. The relative voltage of the $Ga_{0.7}In_{0.3}As$ subcell is plotted as $W_{oc}$ ($=E_g/q-V_{oc}$), where $V_{oc}$ is the open circuit voltage, $E_g$ is the bandgap, and q is the elemental charge, since $E_g$ has small unintentional fluctuations. Lower $W_{oc}$ thus indicates lower nonradiative recombination losses.

The voltage of all subcells is very good, and the threading dislocation density of all devices is low. All $W_{oc}$s are 0.42 V and lower, indicating low nonradiative recombination for all samples, and the threading dislocation density of all samples is suitable for solar cells. However, some measurable loss occurs when implementing a GBBR. The bottom subcell with a GBBR has 20 mV higher $W_{oc}$ than the standard CGB device, and a measurably higher TDD.

In an embodiment, the GaAs subcell photocurrent is increased by 0.5 mA/cm² over the modeled photocurrent of an 800 nm-thick GaAs subcell (FIG. 5), which can dominate the effect of a 20 mV voltage loss if this photocurrent enables a gain in overall multijunction efficiency. Unexpectedly, the bottom subcell with a standard graded buffer on top of a DBR has 10 mV higher $W_{oc}$ than the standard CGB, which indicates some run-to-run variation in performance.

The TDD is reduced in thicker buffers. Although there is some difference between the magnitude of the TDD variation and the magnitude of the Woc variation due to error in the measurement of TDD by CL, the TDD trends match the voltage trends. This is a good indication that changes to dislocation glide and the resulting threading dislocation density are responsible for the voltage changes, rather than some other unintended effect in the subcell.

The voltage is significantly improved in thicker GBBRs, which have lower subcell $W_{oc}$s than the standard CGB-device. The thickest buffer achieves an excellent $W_{oc}$, 0.38 V, which is among the lowest reported for a 1.0 eV subcell. Importantly, the buffer responds predictably as it is thickened. Thicker buffers should enable more efficient dislocation glide, leading to lower threading dislocation density and lower $W_{oc}$. The observed reduction of TDD and $W_{oc}$ with thickness means that the buffer still performs as expected despite the presence of the imbedded DBR.

The dual-purpose graded buffer Bragg reflector performs well in both functions. The reflectance from the GBBR is greater than a similarly designed DBR external to a graded buffer, and not far below the reflectance predicted by the transfer matrix model. There is no unintended parasitic absorption in the GBBR. The GBBR has slightly higher reflection in wavelength regions outside the intended reflection range, but this effect is common to all DBRs and is not specific to the GBBR. The thicker GBBRs have reduced side-lobe reflection, suggesting the possibility of controlling the out-of-band reflection. The threading dislocation density is not substantially increased in the GBBR compared to the CGB. As the GBBR is thickened, the peak reflectance and threading dislocation density exhibit responses which indicate that the presence of one structure is not significantly impacting the performance of the other. The series resistance of these devices is another consideration, since the many layers and interfaces of the GBBR may introduce resistance that limits device performance. Although not shown, the series resistance of all the 2-junction devices are compared using LIV and DIV measurements. The fill factor of all devices is over 86%, and the effective resistance (using R=dV/dI) at 3000 mA/cm$^2$ forward bias is below $10^{-4}$ ohm-cm$^2$ with no measurable differences between devices. Thus, the GBBR does not introduce any additional resistance.

The thinnest buffers achieve over 70% reflectance, which is useful in multijunction solar cells and allows a partial second pass of directly illuminated light. In an embodiment, the stopband is 50-70 nm and is not optimized. This bandwidth is still useful for multijunction cells but could be further improved by using chirped or graded aperiodic structures.

Different optoelectronic devices have different reflectance demands from a DBR. Disclosed herein is a maximum reflectance of 98%, which is also useful in other devices such as resonant cavity light emitting diodes. The index contrast as disclosed herein was limited due to the IMM application. Even higher reflection should be able to be achieved for a given buffer thickness using designs that maximize the index-contrast throughout the buffer, such as $Ga_{1-x}In_xAs/Al_{1-x}In_xAs$. Reflectance of greater than about 99% may be achievable, and would make this technique additionally useful in lasers.

When the GBBR is between two multijunction subcells, light not reflected can still be absorbed by subsequent junctions and contribute to the power output of the device. However, there is some total loss of reflected light that fully passes through the absorber twice, which must be considered. There are many other design considerations for a DBR, such as temperature and angle dependencies. However, because the GBBR performs similarly to a DBR, the design considerations related to the reflection of a GBBR will be similar to a DBR.

IV. Application to Multijunctions with Quantum Wells

Distributed Bragg reflectors have previously been used to enhance the collection of quantum well structures, which are typically only partially absorbing. A 3-junction GaInP/GaAs/GaInAs IMM with quantum wells in the GaAs subcell has high efficiency potential and requires both a DBR and a CGB. To demonstrate the capability of a GBBR in a high efficiency device, a GBBR was implemented into a 3-junction GaInP/GaAs/Ga$_{0.7}$In$_{0.3}$As inverted metamorphic solar cell with strain-balanced quantum wells in the GaAs subcell. The quantum wells consisted of 80 repeats of 16 nm GaAs$_{0.9}$P$_{0.1}$ and 8 nm Ga$_{0.9}$In$_{0.1}$As inside the undoped region of the subcell, which have previously been demonstrated. The GBBR is 2 μm thick, alternating between 30% and 70% aluminum-fraction, and has layer thicknesses that target a peak reflectance at 910 nm.

Figure 7:
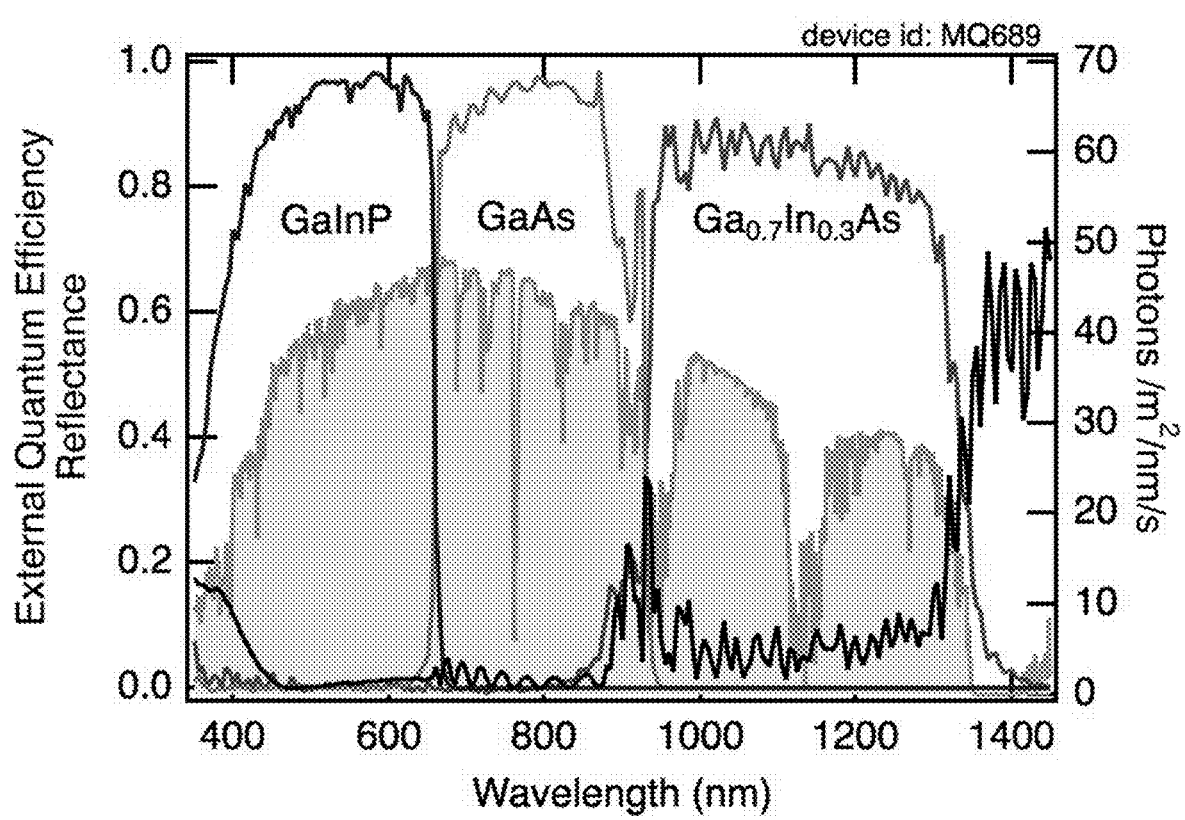
FIG. 7 depicts EQE and reflectance from a 3-junction IMM with MQW in the GaAs subcell. A GBBR is used between the GaAs and $Ga_{0.7}In_{0.3}As$ subcells to both aid MQW absorption and provide access the bottom cell lattice constant.

The EQE and reflectance of the 3-junction device is depicted in FIG. 7 along with the global spectrum. Aided by the GBBR, the EQE is over 60% below the GaAs bandedge and the excitonic absorption peak is 80% at 925 nm. The quantum wells push the absorption edge down to an absorption gap in the global spectrum, and the GaInAs subcell bandgap is also close to an absorption gap. This bandgap combination has high efficiency potential, as has been demonstrated in a 3-junction IMM with two metamorphic buffers, and discussed previously, although operating conditions and temperature sensitivity should be considered.

The subcell photocurrents calculated by integrating the EQE with the global, direct, and AM0 spectra are shown in Table I.

TABLE I

Integrated photocurrents (mA/cm$^2$) from 3J IMM subcell EQEs under global, direct, and AM0 spectra. The bottom row shows the 2nd-junction photocurrent below the GaAs bandedge.

| Junction | global | direct | AM0 |
| --- | --- | --- | --- |
| 1 | 15.6 | 15 | 19.4 |
| 2 | 16.2 | 16.6 | 18.1 |
| 3 | 14.4 | 15.2 | 18.4 |
| 2$^{nd}$ junction sub-GaAs | 2.0 | 2.1 | 2.5 |

Although the device is not optimized for any particular spectrum, the increased collection below the GaAs bandgap is significant. 2.0, 2.1, and 2.5 mA/cm$^2$ increases in photocurrent are calculated under the global, direct, and AM0 spectra, respectively, leading to a summed photocurrent of 31.8, 31.6, and 37.5 mA/cm$^2$, respectively, in the top two subcells. The reflectance shows some side-lobe reflection losses between 950-1350 nm, similar to the reflection as depicted in FIG. 2, which also uses a 2-μm-thick GBBR. There is also reflectance loss due to the main reflection of the DBR between 900-950 nm from light that is not absorbed in the MQW region after two passes. These reflectance losses are general to a DBR and not specific to a GBBR, and the side-lobe reflection loss may be reduced by thickening the buffer or by changing buffer design.

Table II lists the I-V results for the device at 1000 W/m$^2$ and 25° C. (AM0 results at 1366 W/m$^2$ are estimated using 1000 W/m$^2$ measurements).

TABLE II

One-sun illuminated I-V results of a 3-junction IMM device with MQWs in the GaAs subcell, taken under global, direct, and AM0 spectra at 1000 W/m$^2$ and 25° C. AM0 values estimated at 1366 W/m$^2$ are shown in parentheses.

| | global | direct | AM0 |
| --- | --- | --- | --- |
| Eff. (%) | 36.5 | 36.6 | 32.0 (32.4) |
| Voc (V) | 2.92 | 2.92 | 2.90 (2.94) |
| Jsc (mA/cm$^2$) | 14.8 | 14.5 | 12.9 (17.6) |
| FF (%) | 84.3 | 86.1 | 85.1 |

Though not fully optimized, the efficiencies are high: 36.5, 36.6, and 32.4% under the global, direct, and AM0 spectra, respectively. Thus, a GBBR can effectively be implemented in a high efficiency multijunction solar cell that utilizes both functions of the buffer.

In an embodiment, an AlGaInAs graded buffer Bragg reflector can effectively combine both the functions of a distributed Bragg reflector and a compositionally graded buffer without significantly sacrificing the performance of either structure. The reflectance of an AlGaInAs GBBR is within error to that of a similar AlGaAs DBR grown independently of an AlGaInAs CGB. Reflectance of 72, 91, and 98% are shown for 2, 4, and 8-μm GBBRs, respectively, that alternate between 30% and 70% aluminum content to provide index contrast. The W$_O$, and threading dislocation density of a GBBR are slightly higher than that of a CGB without a DBR, but the loss is minor when compared to the performance gains which may be further improved with additional optimization. As disclosed herein, W$_{oc}$s of 0.42, 0.39, and 0.38 V were shown for GBBRs with 2, 4, and 8 μm thickness, respectively. The GBBR performs predictably upon thickening, indicating that the presence of one structure is not significantly impacting the other.

The utility of a GBBR in a 3-junction IMM with MQWs in the GaAs subcell was demonstrated and the structure exhibited the benefits of both a DBR and a CGB. As disclosed herein, the devices collected an additional 2 mA/cm² of sub-bandgap photocurrent while still achieving a high efficiency of 36.5% under the global spectrum. Thus, GBBRs as disclosed herein, can effectively be implemented into multijunction devices. The reflection can aid collection in subcells that are optically thin due to low diffusion length, high bulk recombination, radiation hardness, partially-absorbing quantum structures, or simply for cost savings. Meanwhile, the graded buffer can access material that enables a high efficiency bandgap combination.

The foregoing disclosure has been set forth merely to illustrate the invention and is not intended to be limiting.

What is claimed is:

1. An optoelectronic device comprising at least one graded buffer Bragg reflector comprising a compositionally graded buffer comprising a distributed Bragg reflector comprising layers of alloy wherein the lattice constant of each layer of alloy is different than the adjacent layer of alloy; and
   wherein each layer of alloy has a refractive index that is different than an adjacent layer of alloy; and
   wherein the graded buffer Bragg reflector increases in In-fraction as between alternating layers of $Al_{0.3}Ga_{0.7-x}In_xAs/Al_{0.7}Ga_{0.3-x}In_xAs$.

2. The optoelectronic device of claim 1 wherein the optoelectronic device of claim 1 comprises a light emitting diode.

3. The optoelectronic device of claim 1 wherein the optoelectronic device of claim 1 comprises a laser.

4. The optoelectronic device of claim 1 wherein the optoelectronic device of claim 1 comprises a solar cell.

5. The optoelectronic device of claim 1 comprising a solar cell with an efficiency of at least 36.5 percent when taken under a one-sun illuminated global spectrum at 1000 W/m² at 25° C.

6. The optoelectronic device of claim 1 comprising a solar cell with an efficiency of at least 36.6 percent when taken under a one-sun illuminated direct spectrum at 1000 W/m² at 25° C.

7. The optoelectronic device of claim 1 comprising a solar cell with an efficiency of at least 32 percent when taken under a one-sun illuminated AM0 spectrum at 1000 W/m² at 25° C.

8. The optoelectronic device of claim 1 wherein the graded buffer Bragg reflector has at least 0.5 percent lattice mismatch to a growth substrate of the optoelectronic device.

9. The optoelectronic device of claim 1 comprising at least a subcell that has a relative voltage ($W_{oc}$) that is lower than about 0.42 V and comprises a graded buffer Bragg reflector that is at least 2 µm thick.

10. The optoelectronic device of claim 1 comprising at least 91 percent internal reflectance within at least one graded buffer Bragg reflector.

11. The optoelectronic device of claim 10 comprising at least a subcell that has a relative voltage ($W_{oc}$) that is lower than about 0.39 V and comprises a graded buffer Bragg reflector that is at least 4 µm thick.

12. The optoelectronic device of claim 1 comprising at least 98 percent internal reflectance within at least one graded buffer Bragg reflector.

13. The optoelectronic device of claim 12 comprising at least a subcell that has a relative voltage ($W_{oc}$) that is lower than about 0.38 V and comprises a graded buffer Bragg reflector that is at least 6 µm thick.

14. The optoelectronic device of claim 1 wherein the internal reflectance within at least one graded buffer Bragg reflector is at least 72 percent.

* * * * *